United States Patent [19]
Bigatel et al.

[11] 3,944,419
[45] Mar. 16, 1976

[54] PROXIMITY PRINTING

[75] Inventors: Alfred I. Bigatel, Allentown;
Quentin T. Jarrett, Wescosville;
Ronald A. Petskus, Bethlehem;
David C. Rowan, Allentown; Joseph M. Scheetz, Whitehall, all of Pa.

[73] Assignee: Western Electric Co., Inc., New York, N.Y.

[22] Filed: Jan. 30, 1975

[21] Appl. No.: 545,682

[52] U.S. Cl. .............................. 96/27 R; 355/133
[51] Int. Cl.² .................................... G03C 5/04
[58] Field of Search ............ 96/27 R, 38.3; 428/195; 355/132, 133

[56] References Cited
UNITED STATES PATENTS

| | | | |
|---|---|---|---|
| 3,519,348 | 7/1970 | McLaughlin | 96/38.3 |
| 3,676,002 | 7/1972 | Moreau et al. | 355/133 |

OTHER PUBLICATIONS

Schaible Dimension Control of Photolithographically Produced Patterns IBM Techn. Discl. Bulletin Vol. 8, No. 11 Apr. 1966 p. 1575.

*Primary Examiner*—William E. Schulz
*Attorney, Agent, or Firm*—G. W. Houseweart

[57] ABSTRACT

To avoid damaging photolithographic masks and photoresist coatings on articles during selective exposure of the photoresist coatings, the mask is held very near to, but not in contact with, the photoresist coating during the selective exposure. Because of the close spacing involved, such a technique is commonly termed "proximity printing." To provide suitable spacers for holding a mask in uniform proximity with a photoresist coating, a plurality of droplets of a liquid acrylic resin are dispensed onto the mask and cured in air to harden them. For proximity printing, the mask is simply pressed against the photoresist coating with the droplets therebetween and light of sufficient wavelength and intensity is directed selectively onto the coating through the mask for a sufficient time.

13 Claims, 4 Drawing Figures

PROXIMITY PRINTING

BACKGROUND OF THE INVENTION

1. Field of the Invention

This invention relates to the use of photolithographic masks for selectively exposing portions of photosensitive materials; and, more particularly, to the formation and use of integral spacers on such masks for holding the masks in substantially uniform proximity with the photosensitive material during the selective exposure.

As is well known, photolithographic processes are conventionally used in the fabrication of semiconductor devices and thin film devices. In such processes, a photolithographic mask, hereinafter termed simply a "mask", typically includes either opaque image portions on an otherwise transparent background or transparent image portions on an otherwise opaque background, depending upon whether a positive photoresist or a negative photoresist coating is to be employed on the article to be processed.

The term "positive" photoresist is used to designate that type of photosensitive material having the characteristic that exposure to light of suitable wavelength allows the exposed portions to be subsequently removed or developed away. "Negative" photoresist is the opposite type photosensitive material, wherein those portions which are exposed are the portions which are retained after development.

Early photolithographic processes typically employed "contact" printing wherein the mask was simply pressed into intimate contact with the photosensitive coating and light was directed through the mask to selectively expose the coating. (See, e.g., Tong, "Mack Manufacture for Integrated Circuits," The Western Electric Engineer, Dec. 1967, pp. 34–43.) Contact printing, while eminently suitable for sharp-line definition, suffers the problem that masks themselves are often not perfectly flat, but more seriously from the problem that semiconductor wafers containing photosensitive coatings typically have spikes protruding therefrom or dirt particles thereon which are sufficiently hard to scratch either the mask or the photosensitive coating itself. Because scratches on the mask and/or scratches in the photosensitive coating deleteriously affect the quality of the selective exposure, such scratching can rapidly destroy the usefulness of the mask and can also degrade the yield of the articles being processed.

To prevent scratching of the photomasks and of the photosensitive layers on the articles being processed, it has become conventional to employ proximity printing, wherein the mask is held near to, but uniformly spaced from, the photosensitive coating to accomplish the selective exposure. Considerable time, effort and money has been spent in developing complex and still, in many ways, unsatisfactory equipment to sufficiently reproducibly achieve the requisite very close spacings, e.g., from less than a mil (0.001 inch) to a few mils, typically used in proximity printing.

DESCRIPTION OF THE PRIOR ART

Evaporation of a metal, such as aluminum, selectively through a suitable mask onto a surface of a photolithographic mask to form precisely positioned spacer material of relatively precise dimensions is disclosed in U.S. Pat. No. 3,519,348 issued July 7, 1970 to J. L. McLaughlin. Although suitable spacers probably are formed thereby, the complexity and expense involved with evaporating material in the requisite high vacuum system is a problem where one, as always, is trying to employ the least expensive mask which will accomplish the desired objective.

Use of separate thin metallic shims is disclosed in an article entitled, "Dimensional Control of Photolithographically Produced Patterns" by P. M. Schaible in IBM Technical Disclosure Bulletin, Vol. 8, No. 11, April 1966, page 1575. Although simple in concept, use of metallic shims of the requisite thinness, e.g., about 0.0005 inch, has been found to be practically unworkable due to the relative fragility of such films of material.

A more conceptually interesting prior technique for forming spacers to be used in proximity printing is disclosed in U.S. Pat. No. 3,676,002 issued July 7, 1972 to W. M. Moreau et al. Moreau et al. teach nonselectively coating a mask with a photosensitive material which is then exposed through the mask itself to leave the transparent material on only those portions of the mask which are transparent. Particular advantages are alleged when using photosensitive material having an index of refraction similar to that of the photoresist which is used on the article being processed. As with the aforementioned prior art disclosures, the Moreau et al. teaching is in terms of precisely forming spacers via relatively complex techniques, all of which will hereinafter be seen to be unnecessary through use of the instant invention.

Still another prior technique for solving the aforementioned problem of forming spacers for use in proximity printing, is the exceedingly simple technique involving nonselectively coating the mask with a transparent material of sufficient thickness to provide the desired spacing and concomitant freedom from scratching. Unfortunately, the simple technique of coating the entire mask suffers from a problem in forming a coating of sufficient thickness uniformity and also from the problem that the coating itself becomes scratched and thereafter light passing therethrough can be scattered from the scratched portions.

SUMMARY OF THE INVENTION

In view of the aforementioned and other problems inherent in prior art methods and apparatus for achieving proximity printing, it is an object of this invention to provide new and improved methods and apparatus for holding a mask in sufficiently uniform proximity with a photosensitive material during selective exposure of that material.

To this and other ends, a method of selectively exposing portions of a photosensitive layer in accordance with this invention includes forming a plurality of spacers onto a surface of a mask by dispensing a plurality of droplets of a liquid onto the mask. The droplets are hardened sufficiently to hold the mask in substantially uniformly spaced relationship with the photosensitive layer when the mask is placed against the layer with the droplets therebetween. With the mask so positioned, electromagnetic radiation of sufficient wavelength and intensity is projected through the mask for a time sufficient to selectively expose the photosensitive material.

In a preferred embodiment the droplets are dispensed through a tube, such as a hypodermic needle, at the end of a syringe. Such dispensing is advantageously accomplished by forming a droplet at the end of the tube and then placing the droplet in contact with the surface of the mask on which the image patterns are disposed. This dispensing operation is repeated for a number of times sufficient to produce the desired number of droplets. Alternatively, of course, the plurality of droplets can be dispensed simultaneous via a corresponding plurality of of tubes.

In one form of the preferred embodiment, a uniform transparent layer of a material which may be similar to or identical with the material used for the droplets is first formed over the image surface of the mask and then the droplets are formed thereover.

Preferably, the liquid is an optical grade acrylic resin which is cured by heating to an elevated temperature in air to form the desired droplet-shaped spacers.

BRIEF DESCRIPTION OF THE DRAWING

The aforementioned and other features, characteristics, and advantages, and the invention in general, will be better understood from the following detailed description taken in conjunction with the accompanying drawing in which.

Figure 1:
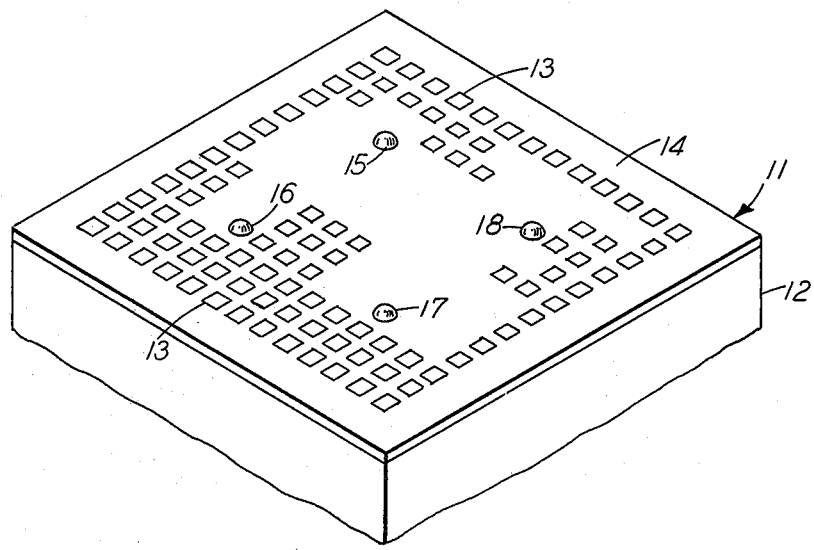
FIG. 1 is an isometric view of a mask having a plurality of droplet-shaped spacers thereon.

It will be appreciated that for simplicity and clarity of explanation the figures have not necessarily been drawn to scale. Further, where considered appropriate, reference numerals have been repeated in more than one figure to indicate corresponding features.

DETAILED DESCRIPTION

With reference now to the drawing, FIG. 1 shows an isometric view of a mask 11 including a transparent substrate 12, which typically is glass. A plurality of opaque features or image elements 13 are disposed upon and contiguous with the upper surface of substrate 12.

Commonly, although not necessarily, image elements 13 are in the form of opaque portions of a continuous emulsion layer 14 which is otherwise transparent. Alternatively, of course, the image elements may be transparent portions in an otherwise opaque background and may be selectively deposited or otherwise selectively formed regions, such as an opaque metal, e.g., chrome, or iron oxide which is not completely opaque to visible light but is opaque to the wavelength used to expose photoresist layers. Such wavelengths, as will be discussed in more detail hereinbelow, typically are in the far ultraviolet region of the electromagnetic spectrum.

A plurality of generally hemispherically-shaped protrusions 15-18 are seen to be disposed approximately in the center of each of four imaginary quadrants on mask 11. Protrusions 15–18 are for the purpose of providing spacers to hold all portions of mask 11 at an approximately uniform distance from the surface of a photosensitive coating during selective exposure of that coating through the mask, all of which will be discussed in greater detail hereinbelow. Protrusions 15–18 advantageously are formed by dispensing a plurality of droplets 15–18 of a suitable liquid onto the surface of mask 11 and then solidifying the droplets sufficiently to enable them to serve the desired spacing function.

In a preferred embodiment, an optical grade acrylic resin, such as a clear laminating plastic of the type available, for example, from the Flecto Company, Oakland, California under the tradename "Flecto Acrylic Resin No. 2000" is used for the hardenable liquid. That particular resin has a viscosity of about 170 centipoises and may be cured by simple exposure to air for a period of hours or, advantageously, by heating to approximately 75°C. for two hours in air.

Figure 2:
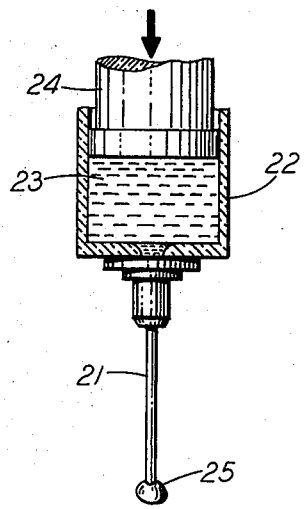
FIG. 2 is a cross-sectional view of apparatus suitable for dispensing the droplets.

Protrusions 15–18 advantageously are formed on the surface of mask 11 by dispensing through a conventional capillary tube 21 connected to a syringe, such as is shown in cross section in FIG. 2. As seen in FIG. 2, a capillary tube 21 communicates with a reservoir 22 containing a quantity 23 of the liquid to be dispensed. Liquid 23 is forced out of reservoir 22 through capillary 21 by urging a piston member 24 against the liquid. In operation with manual apparatus of the type depicted in FIG. 2, one simply presses on plunger 24 sufficiently to form a droplet 25 at the lower end of capillary 21. With liquid of viscosity such as mentioned above, a 30 gauge needle (0.006 inch inner diameter) has been successfully used. Advantageously the lower end of needle 21 is flattened to facilitate forming a spherical droplet 25 and also to avoid excessive damage to the emulsion layer on a mask during dispensing of the droplets.

Having formed the droplet 25 at the lower end of capillary 21, one simply positions droplet 25 into contact with the image surface of mask 11 and withdraws the apparatus of FIG. 2 away from the mask, leaving the droplet on the mask. This process is repeated successively to form the desired number of droplets. Of course, a great variety of alternate techniques for dispensing droplets onto a mask will readily occur to those skilled in the art. For example, a precision metering/dispensing system of the type such as is sold by TRIDAK, Inc., 5 Valley Road, Danbury, Conneticut under the tradename TRIDAK, Model 200 may be used with one or a plurality of dispensing tubes for more sophisticated dispensing of the droplets.

Because of the extremely small sizes involved, a liquid such as the Flecto Acrylic Resin mentioned above advantageously is filtered through a one micron filter such as a DURALON NR filter available from the Millipore Corp., Bedford, Massachusetts prior to attempting to dispense that liquid through a capillary needle. It has been found that with use of an acrylic resin of the type mentioned above filtered through a one micron filter, one can manually dispense droplets of sufficiently uniform size with little difficulty. For example, droplets having a nominal height of about 0.5 mils (0.0005 inch) can be reproducibly formed with a tolerance of approximately plus or minus 0.1 mil.

Typically, it has been found that such droplets do not usually survive in the form of hemispherical protrusions, but rather become bimodal, i.e., having two humps with a depression near the center of the droplet caused by shrinkage of the liquid during curing. Rather than being detrimental, such bimodality is believed to be desirable, as it gives a greater surface area for contact with the photoresist coating against which it is ultimately positioned for the selective exposure of that coating.

Figure 3:
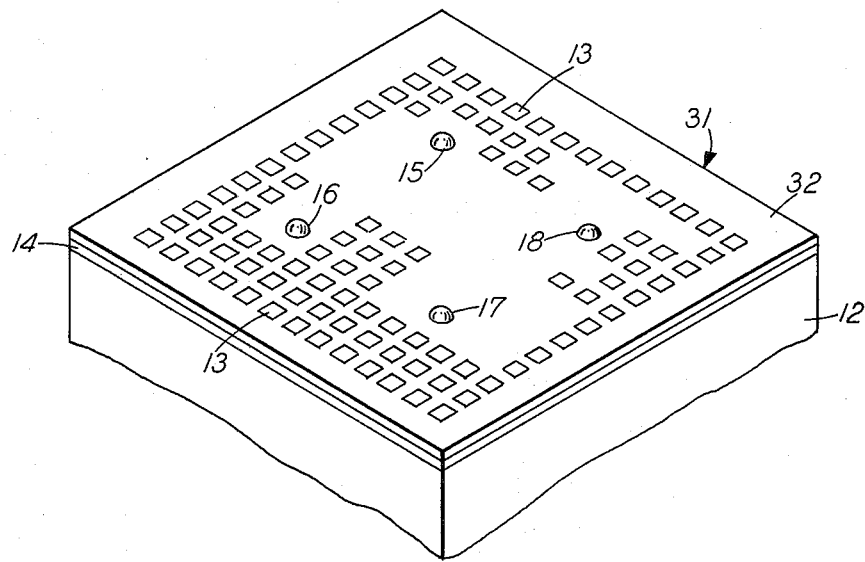
FIG. 3 is an isometric view of a mask including both a transparent protective coating and droplet shaped spacers on top of the coating.

With reference now to FIG. 3 there is shown an isometric view of a mask 31, similar in all respects to mask 11 of FIG. 1, except that at least the image surface of mask 31 is uniformly coated with a transparent layer 32 to provide still further protection for the mask during exposure. The transparent coating 32 may be of the same material as the above-specified acrylic resin used for the droplets and may be applied by dispensing the liquid material onto the mask and spinning the mask, for example at approximately 3500 revolutions per minute for about 30 seconds to distribute the liquid uniformly on the mask. As with the droplets, the transparent coating may be cured by heating to an elevated temperature in air or simply by allowing the mask with the coating thereon to sit in air for several hours.

Figure 4:
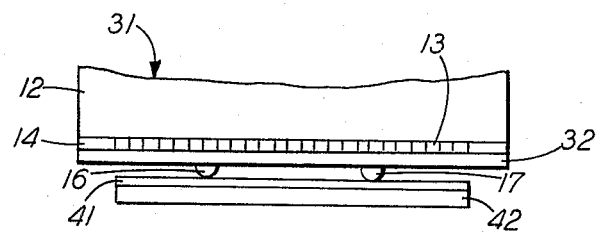
FIG. 4 is a cross-sectional view of a mask of the type shown in FIG. 3 as it appears when positioned in uniform proximity with a semiconductor wafer containing a photoresist coating.

FIG. 4 shows a cross sectional view of mask 31 of FIG. 3 placed in contact with a photoresist coating 41 on the surface of a semiconductor wafer 42. As is readily seen in FIG. 4, the droplets, of which only 16 and 17 are visible in FIG. 4, hold mask 31 at a substantially uniform distance from, i.e., in substantially uniform proximity with, photoresist coating 41.

Of course in practice, a mask such as mask 11 or mask 31 typically would be held in place in a machine adapted for exposing photosensitive materials. Such machines are well known and commercially available from a variety of sources; however, particular machines such as those available from Kulicke and Soffa, Horsham, Penna., under the designation Model 686 or the designation Model 686B, which produce clamping forces in the range of 100 to 500 grams for holding the wafer in contact with the mask can be used.

Experience has shown that use of transparent coatings over the entire mask in combination with the droplets provides useful further protection from scratching on masks which are intended to be used with positive photoresists, but generally not on masks which are intended to be used with negative photoresist. It is postulated that the reason for this difference is that masks intended for use with positive photoresist include transparent features on an otherwise opaque background. As a result, any scratches in the transparent coating which would tend to scatter light are not as deleteriously effective on those masks because of their predominant opacity.

The foregoing is, of course, not true with respect to masks intended for use with negative photoresist, because those masks include opaque features on an otherwise transparent background. As a result, any damage such as scratches which are incurred by the transparent coating, tend to deleteriously affect the selective exposure of an underlying negative photoresist coating.

Droplet-shaped spacers having an average height of about 0.5 mil and a typical average lateral extent of 25 to 40 mils have been used successfully with both negative and positive resists. Although there are a great variety of such resists available, reference is made to the AZOPLATE AZ-111 positive photoresist available from Shipley, Inc., Newton, Massachusetts which typically is exposed for seven seconds at an intensity of approximately 800 footcandles of electromagnetic radiation such as ultraviolet light from a 200 watt ultraviolet source, such as a mercury vapor lamp, which light is collimated via lenses between the lamp and the workpieces. Also by way of example, reference is made to a particular negative photoresist provided by the Hunt Chemical Company, Palisades Park, New Jersey under the trade designation Waycoat IC Photoresist Type 3. This negative photoresist typically is exposed for a period of about 1.5 seconds using the same light source as is referenced immediately above for the positive photoresist.

At this point it is believed the principles of this invention have been described in sufficient detail to enable one skilled in the art to practice the invention. Although the invention has been described in part by making detailed reference to specific embodiments, such details are intended to be and will be understood to be instructive rather than restrictive. It will be appreciated by those skilled in the art that many variations may be made in the structure and methods of use without departing from the spirit and scope of the invention as disclosed in the foregoing teachings.

For example, it should be apparent that any plastic-like material such as liquid epoxy resins or liquid plastics may be used as alternates for the particular specified optical grade acrylic resin. Such alternatives, of course, may include but are certainly not restricted to organic polymers or copolymers which will cure to a semihard to hard, roughly spherical mound.

Further, of course, although it is for same reasons desirable that the droplet-shaped spacers be transparent so that any features of the mask thereunder are not rendered ineffective, opaque, translucent, or semitransparent droplets may as well be used inasmuch as the physical extent of the droplets is typically rather small compared to the number of features on the mask so that any such features rendered ineffective constitute but a small percentage of the total features.

Further, of course, the droplets need not be positioned even approximately at the centers of imaginary quadrants dividing the mask, but may be positioned in any desired random pattern and in any desired plurality, depending upon the particular application.

What is claimed is:

1. A method of selectively exposing portions of a photosensitive layer comprising:
    dispensing a plurality of droplets of a liquid onto a surface of a mask;
    solidifying the droplets sufficiently to enable them to hold the mask away from the photosensitive layer;
    placing the mask adjacent the photosensitive layer with the droplets therebetween and with the droplets in contact with the mask and the layer; and
    projecting electromagnetic radiation of sufficient wavelength and intensity through the mask for a time sufficient to selectively expose the photosensitive layer.

2. A method as recited in claim 1 wherein the dispensing step includes:
    forming a droplet at one end of a capillary tube;
    moving the tube sufficiently to bring the droplet in contact with the surface of the mask; and
    removing the tube from the mask while leaving the droplet on the mask.

3. A method as recited in claim 1 wherein the liquid is selected from the group consisting of organic polymers and copolymers which can be cured to a semihard to hard consistency.

4. A method as recited in claim 3 wherein the liquid is transparent after the solidifying step.

5. A method as recited in claim 4 wherein the liquid is an acrylic resin.

6. A method as recited in claim 5 wherein the curing step is accomplished by heating the mask and the droplets thereon in air.

7. A method as recited in claim 6 wherein the mask and droplets are maintained at 75°C for about two hours.

8. A method as recited in claim 3 wherein the liquid is an epoxy resin.

9. A method as recited in claim 3 wherein the liquid is a liquid plastic.

10. A method as recited in claim 1 wherein the mask includes an array of image patterns on one surface of an otherwise transparent substrate and the droplets are dispensed onto said surface.

11. A method as recited in claim 10 wherein the mask includes a transparent coating over substantially all of said one surface and the droplets are dispensed onto said transparent coating.

12. A method of selectively exposing portions of a photosensitive layer comprising:
   filtering a liquid acrylic resin;
   dispensing a plurality of droplets of the liquid acrylic resin through a tube and onto a surface of a mask;
   curing the resin to form bimodal protrusions on said surface;
   placing the mask adjacent the photosensitive layer with the cured bimodal protrusions therebetween and with the protrusions in contact with the mask and the layer; and
   projecting electromagnetic radiation of sufficient wavelength and intensity through the mask for a time sufficient to selectively expose the photosensitive layer.

13. In a photoresist mask of the type including an array of opaque portions on an otherwise transparent substrate, the improvement comprising:
   a plurality of droplet shaped spacers formed on the surface thereof by selectively dispensing droplets of a liquid onto the surface and then solidifying the liquid sufficiently to enable the droplets to hold the mask away from another article.

* * * * *